(12) United States Patent
Chen et al.

(10) Patent No.: US 11,690,227 B2
(45) Date of Patent: Jun. 27, 2023

(54) METHOD OF FORMING HIGH-VOLTAGE TRANSISTOR WITH THIN GATE POLY

(71) Applicant: Cypress Semiconductor Corporation, San Jose, CA (US)

(72) Inventors: Chun Chen, San Jose, CA (US); James Pak, Sunnyvale, CA (US); Unsoon Kim, San Jose, CA (US); Inkuk Kang, San Jose, CA (US); Sung-Taeg Kang, Palo Alto, CA (US); Kuo Tung Chang, Saratoga, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 26 days.

(21) Appl. No.: 17/323,819

(22) Filed: May 18, 2021

(65) Prior Publication Data

US 2021/0296343 A1    Sep. 23, 2021

Related U.S. Application Data

(63) Continuation of application No. 16/292,042, filed on Mar. 4, 2019, now abandoned, which is a
(Continued)

(51) Int. Cl.
*H01L 21/28* (2006.01)
*H01L 21/265* (2006.01)
(Continued)

(52) U.S. Cl.
CPC ....... *H10B 43/40* (2023.02); *H01L 21/26513* (2013.01); *H01L 21/28052* (2013.01);
(Continued)

(58) Field of Classification Search
CPC ......... H01L 27/11573; H01L 27/11521; H01L 27/11568; H01L 29/40117;
(Continued)

(56) References Cited

U.S. PATENT DOCUMENTS

| 9,659,953 B2 | 5/2017 | Chuang et al. |
| 2006/0216900 A1 * | 9/2006 | Wang .................. H01L 29/6659 257/E29.063 |

(Continued)

FOREIGN PATENT DOCUMENTS

| JP | 2010067748 A | 3/2010 |
| JP | 2013243289 A | 12/2013 |

(Continued)

OTHER PUBLICATIONS

China National Intellectual Property Administration (CNIPA) office action for international application No. 201880041674.2 (2017P60058WOCN) dated Mar. 6, 2023, 10 pages.

*Primary Examiner* — Antonio B Crite

(57) ABSTRACT

A semiconductor device and method of fabricating the same are disclosed. The method includes depositing a polysilicon gate layer over a gate dielectric formed over a surface of a substrate in a peripheral region, forming a dielectric layer over the polysilicon gate layer and depositing a height-enhancing (HE) film over the dielectric layer. The HE film, the dielectric layer, the polysilicon gate layer and the gate dielectric are then patterned for a high-voltage Field Effect Transistor (HVFET) gate to be formed in the peripheral region. A high energy implant is performed to form at least one lightly doped region in a source or drain region in the substrate adjacent to the HVFET gate. The HE film is then removed, and a low voltage (LV) logic FET formed on the substrate in the peripheral region. In one embodiment, the LV logic FET is a high-k metal-gate logic FET.

21 Claims, 17 Drawing Sheets

Related U.S. Application Data continuation of application No. 15/848,327, filed on Dec. 20, 2017, now Pat. No. 10,242,996.

(60) Provisional application No. 62/534,463, filed on Jul. 19, 2017.

(51) Int. Cl.

| | |
|---|---|
| *H01L 21/285* | (2006.01) |
| *H01L 29/423* | (2006.01) |
| *H01L 29/49* | (2006.01) |
| *H01L 29/66* | (2006.01) |
| *H01L 29/78* | (2006.01) |
| *H01L 29/792* | (2006.01) |
| *H10B 43/40* | (2023.01) |
| *H10B 41/30* | (2023.01) |
| *H10B 41/49* | (2023.01) |
| *H10B 43/30* | (2023.01) |
| *H10B 43/35* | (2023.01) |
| *H01L 29/45* | (2006.01) |
| *H01L 29/51* | (2006.01) |

(52) U.S. Cl.
CPC .. *H01L 21/28518* (2013.01); *H01L 29/40114* (2019.08); *H01L 29/40117* (2019.08); *H01L 29/42328* (2013.01); *H01L 29/42344* (2013.01); *H01L 29/456* (2013.01); *H01L 29/4933* (2013.01); *H01L 29/6659* (2013.01); *H01L 29/66545* (2013.01); *H01L 29/66833* (2013.01); *H01L 29/7833* (2013.01); *H01L 29/792* (2013.01); *H10B 41/30* (2023.02); *H10B 41/49* (2023.02); *H10B 43/30* (2023.02); *H10B 43/35* (2023.02); *H01L 29/517* (2013.01)

(58) Field of Classification Search
CPC ............ H01L 29/66833; H01L 29/792; H01L 29/42328; H01L 29/42344; H01L 29/66545

See application file for complete search history.

(56) References Cited

U.S. PATENT DOCUMENTS

| | | |
|---|---|---|
| 2008/0315281 A1 | 12/2008 | Park |
| 2013/0009216 A1 | 1/2013 | Tsai et al. |

FOREIGN PATENT DOCUMENTS

| | | | | |
|---|---|---|---|---|
| JP | 2017037986 A | | 2/2017 | |
| WO | WO-2015047701 A1 | * | 4/2015 | ......... H01L 21/2658 |
| WO | 2016147316 A1 | | 9/2016 | |

* cited by examiner

METHOD OF FORMING HIGH-VOLTAGE TRANSISTOR WITH THIN GATE POLY

CROSS-REFERENCE TO RELATED APPLICATIONS

This application is a Continuation of U.S. patent application Ser. No. 16/292,042, filed on Mar. 4, 2019, which is a Continuation of U.S. patent application Ser. No. 15/848,327, filed on Dec. 20, 2017, now U.S. Pat. No. 10,242,996, issued on Mar. 26, 2019, which claims the benefit of priority under 35 U.S.C. 119(e) to U.S. Provisional Patent Application Ser. No. 62/534,463, filed Jul. 19, 2017, all of which are incorporated by reference herein in their entirety.

TECHNICAL FIELD

This disclosure relates generally to semiconductor devices and more particularly to non-volatile memory (NVM) devices including memory cells, high-voltage field effect transistor (HVFETs) and advanced logic FETs embedded or integrally formed on a single substrate and methods for fabricating the same.

BACKGROUND

Flash or Non-volatile memory (NVM) devices typically include a grid or an array of storage elements or cells, each including at least one NVM transistor and a number of peripheral circuits including decoders, drivers, sense amplifiers and control circuits to read from and write to the array. NVM transistors generally include a charge-trapping or charge storage layer, and require a high voltage (HV) in the range of four to ten volts for program and erase operations. The peripheral circuits include logic Field Effect Transistors (FETs), which typically operate at a low voltage, as well as a number of HVFETs capable of supporting the high voltages required by the NVM transistors.

It is becoming increasingly common to monolithically incorporate logic FETs and HVFETs on the same substrate as the memory cells to provide improved efficiency, security, functionality, and reliability. However, incorporating logic FETs and HVFETs on the same substrate along with the NVM transistors is challenging as each device or transistor typically requires different fabrication parameters.

Accordingly, there is a need for a semiconductor or NVM device integrating memory cells, HVFETs and logic FETs embedded or integrally formed on a single substrate, and methods for fabricating the same.

SUMMARY

A semiconductor device and method of fabricating the same are provided. Generally, the method begins with forming an ONO stack for a memory gate (MG) to be formed over a surface of a substrate in a memory region of the substrate, and forming a gate dielectric for high-voltage Field Effect Transistor (HVFET) gate to be formed over the surface of the substrate in a peripheral region. Next, a polysilicon gate layer is deposited over the ONO stack and the gate dielectric, a dielectric layer formed over the polysilicon gate layer, and a height-enhancing (HE) film deposited over the dielectric layer. The HE film, dielectric layer, gate layer, gate dielectric and ONO stack are then patterned for the MG and HVFET gate. A source/drain (S/D) region is implanted adjacent to the HVFET gate, and the HE polysilicon layer removed to form the MG and HVFET gate. The depth of the S/D region in the substrate is generally greater than a height of the HVFET gate above the surface of the substrate. In some embodiments, the HE film includes amorphous silicon or polysilicon, and is sufficiently thick to prevent dopants from the drain implant from reaching a channel underlying the HVFET gate.

According to another embodiment the method further includes, subsequent to removing the HE film, forming a polysilicon gate for a low voltage (LV) logic FET including in the peripheral region, and replacing the polysilicon gate of the LV logic FET with a metal-gate using a high-K metal gate (HKMG) process.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
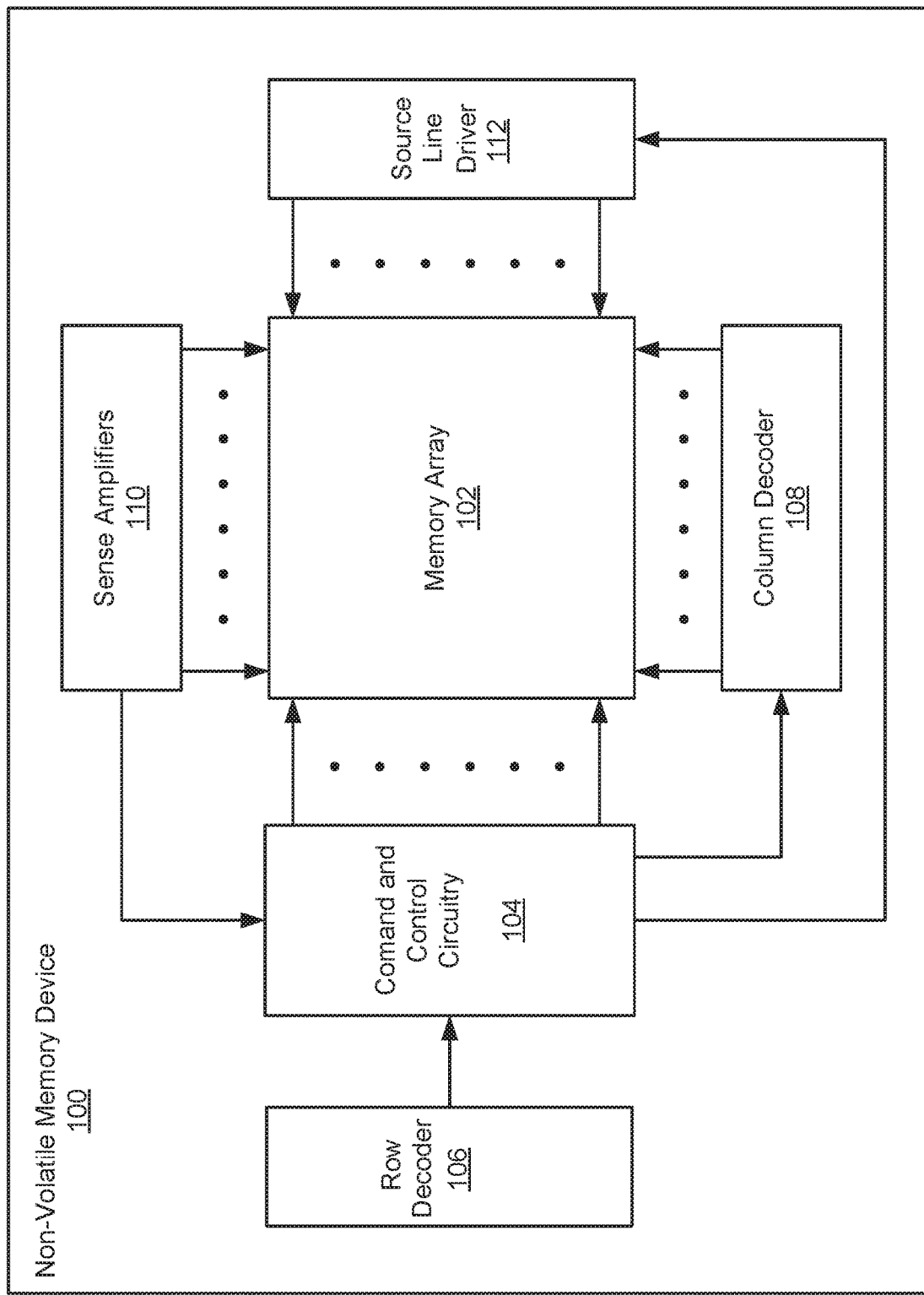
FIG. 1 is a schematic block diagram of a non-volatile memory (NVM) device including an array of memory cells and a number of peripheral circuits including decoders, drivers, sense amplifiers and control circuits integrally formed on a single substrate.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that may or may not use a mask, and may or may not leave behind a portion of the material after the etch process is complete.

The above description serves to distinguish the term "etching" from "removing." When removing a material, substantially all of the material is removed in the process. However, in some embodiments, 'removing' is considered to be a broad term that may incorporate etching.

The term "CMP" is used herein to generally describe a chemical mechanical polishing or planarization process used to smooth a surface on or over a substrate during semiconductor fabrication. The process generally uses combination of an abrasive and/or corrosive colloidal slurry in conjunction with mechanical forces provided by affixing the substrate to a dynamic polishing head pressing it against a rotating a polishing pad. The process removes material from the substrate thereby providing a planarized surface.

During the descriptions herein, various regions of the substrate upon which the memory cell, logic and high voltage transistors or devices are fabricated are mentioned. Although two different regions are described herein, it should be understood that any number of regions may exist on the substrate and may designate areas having certain, types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc., or a hardmask including silicon nitride.

Before describing such embodiments in more detail, it is instructive to present an example memory cell and environment in which the present embodiments may be implemented.

FIG. 1 illustrates a schematic block diagram of a non-volatile memory (NVM) device 100 including a memory array 102 and a number of peripheral circuits including decoders, drivers, sense amplifiers and control circuits integrally formed on a single substrate to read from and write to the memory array 102. Referring to FIG. 1, the NVM device 100 further includes command and control circuitry 104, such as a micro-controller, micro-processor or state machine, to issue commands or control signals to each of the memory cells (not shown in this figure) in the memory array 102 along with other peripheral circuits for reading from or writing to the memory array. Generally, the peripheral circuits further include a row decoder 106, a column decoder 108, sense amplifiers 110 and a source line driver 112.

When a data word is to be stored or written to the NVM device 100, the row decoder 106 receives and decodes a memory address, which is then supplied to the command and control circuitry 104. The command and control circuitry 104 then selects a row of memory cells in the memory array 102 by applying a signal to wordlines (WL) of memory cells in the selected row, provides a column address to the column decoder 108, and provides a control signal to the source line driver 112. The column decoder 108 converts the column address and applies a signal to a bit-line (BL) of each memory cell in the selected column. The source line driver 112 then couples a high voltage, typically from about four to about ten volts DC to source lines of the memory cells to program or erase a NVM transistor in the memory cell.

Generally, when a data word is to be recalled or read out from the NVM device 100 the row decoder 106 receives, decodes and supplies the memory address, to the command and control circuitry 104, which then selects a row of memory cells in the memory array 102 by applying a signal to WLs of memory cells in the selected row, provides a column address to the column decoder 108, and provides a control signal to the source line driver 112, and the sense amplifiers 110 compare a data voltage for each memory cell in the selected row to a reference voltage to determine whether a logic '0' or '1' is read from the cell.

Each of the peripheral circuits may include a large number of low voltage, logic Field Effect Transistors (FETs), while the a row decoder 106 and a source line driver 112 further include a number of high voltage Field Effect Transistors (HVFETs) to support the voltages (e.g., 4 to 10V) required for program and erase operations.

Figure 2:
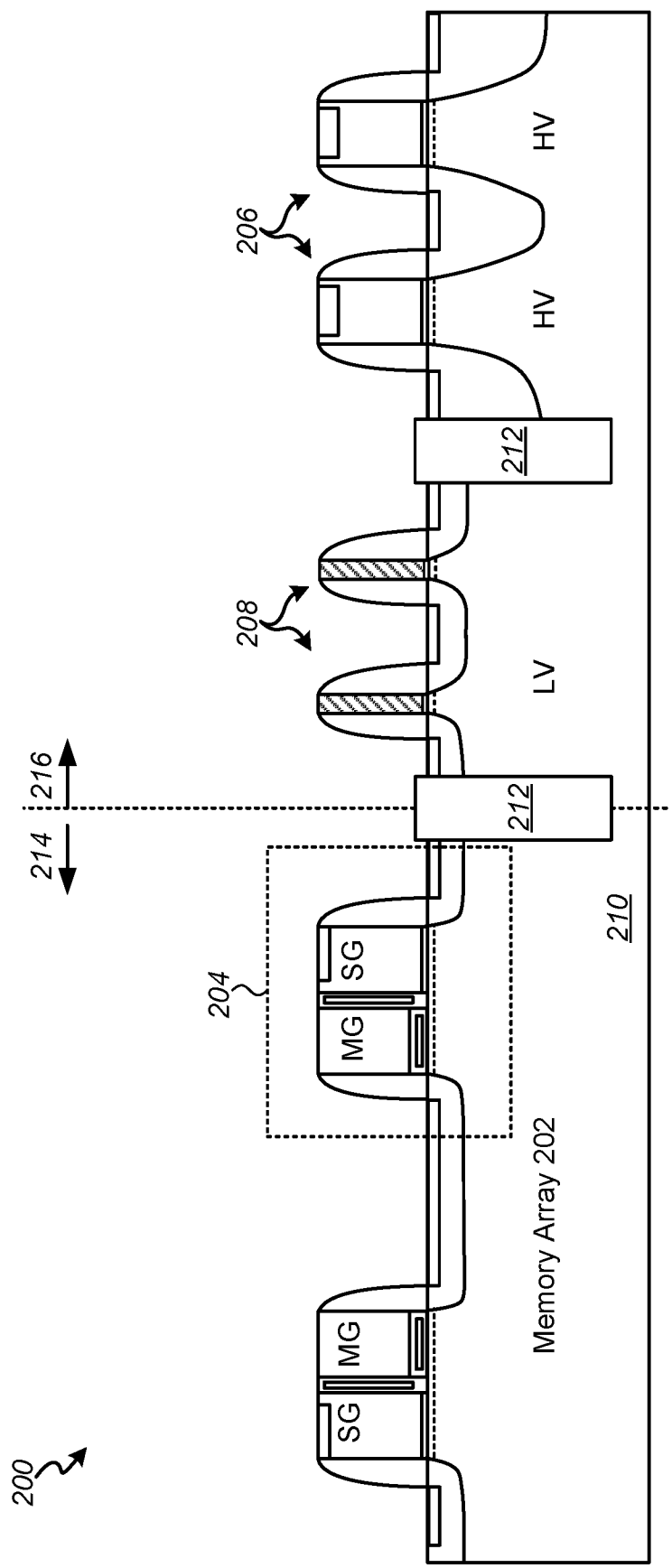
FIG. 2 is a block diagram of a cross-section of a portion of a NVM device including split-gate memory cells in a memory region, and a HVFET and logic FET in a peripheral region according to an embodiment of the present disclosure.

FIG. 2 illustrates a cross-section of a portion of a NVM device 200 that includes a memory array 202 formed on a substrate 210 in a memory region 214. The NVM device 200 further includes a HVFET 206 and a logic FET 208 formed in or on a peripheral region 216 of the same substrate 210. In the embodiment shown the memory cells are split-gate memory cells, each including a memory gate (MG) and a select gate (SG). Generally, as in the embodiment shown adjacent memory cells 204, HVFET 206 and logic FET 208 are isolated from one another by Shallow Trench Isolation structures (STI 212) that surround each area or region or device. In this example, substrate 210 includes a memory region 214 in which the memory cells 204 are located, and a peripheral region 216. The peripheral region 216 is further divided by STI 212 into a logic or low voltage area (LV) in which the logic FET 208 is formed, and HV area in which the HVFET 206 is formed. In the embodiment shown, the memory array 202 includes a plurality of split-gate memory cells 204, each including a memory gate (MG) and a select (SG). It should be understood that the cross-section of FIG. 2 is only exemplary, and that the peripheral region 216 may further include additional integrated circuit components such as resistors, capacitors, inductors, etc., not shown in this figure as well as the logic FET 208 and HVFET 206. It should also be understood that the memory region 214 and peripheral region 216 may be located in any area of substrate 210, including non-adjacent areas, and may include multiple instances of each of the different regions 214/216.

Substrate 210, and indeed substrates in general as used throughout the description, can be silicon according to various embodiments. However, the substrate 210 may also be any of a wide array of semiconductor materials such as germanium, gallium arsenide, indium phosphide, etc. In other embodiments, the substrate 210 may be electrically non-conductive such as a glass or sapphire wafer.

The memory cell 204, logic FET 208 and HVFET 206 will now be described in greater detail with reference to FIGS. 3 through 5.

Figure 3:
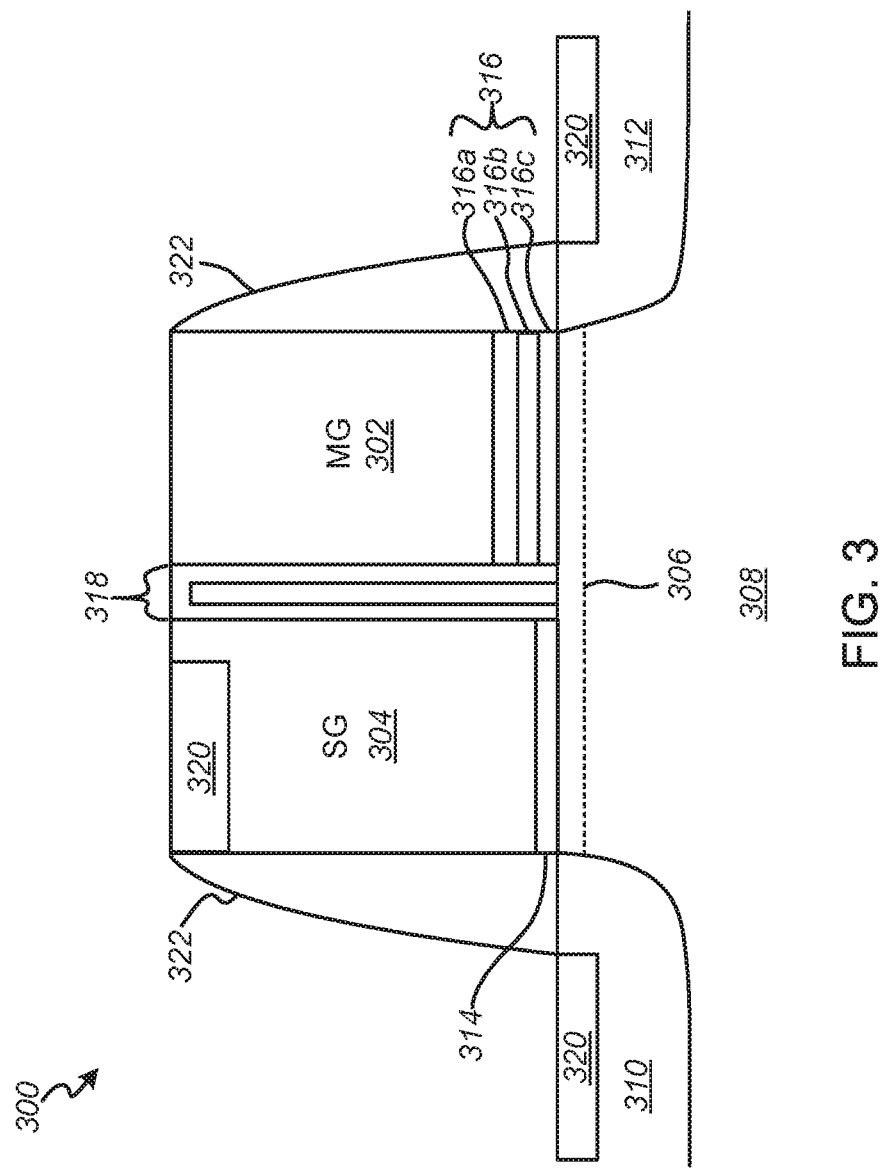
FIG. 3 is a detailed block diagram of a cross-section of an embodiment of a split-gate memory cell of FIG. 2 according to an embodiment of the present disclosure.

FIG. 3 illustrates an example of a split-gate memory cell 300 including a memory gate (MG 302) and a select gate (SG 304) formed over a common or shared channel 306 on a substrate 308. Each memory cell includes first and second source/drain (S/D) regions 310 and 312. Regions 310 and 312 form either the source or drain of the split-gate memory cell 300 depending on what potentials are applied to each. In split-gate memory cells 300, for convenience, region 310, which is adjacent to the SG 304, is commonly referred to as the drain, while region 312, adjacent to the MG 302, is commonly referred to as the source, independent of the relative biases. Generally, the substrate 308 is a p-type silicon substrate or includes a p-type well in which the memory cells 300 are formed, while regions 310 and 312 are moderately to heavily doped with an n-type dopant. However, it is also possible for substrate 308 to be n-type while regions 310 and 312 are doped with a p-type dopant.

The MG 302 and SG 304 both include a doped polysilicon conductor. The doped polysilicon conductor of SG 304 is disposed on or over a select gate dielectric 314, while the doped polysilicon conductor of MG gate 302 is disposed on or over a multi-layer, charge storing or trapping stack 316 having one or more charge trapping layers between dielectric layers. In one example, charge trapping stack 316 includes a charge trapping silicon nitride layer 316b sandwiched between two silicon dioxide layers 316a, 316c to create a three-layer structure collectively and commonly referred to as an "ONO stack." Other charge trapping stacks 316 may include a polysilicon charge storing layer 316b sandwiched between two dielectric layers 316a, 316c to create a floating gate MOS field-effect transistor (FGMOS). A vertical, inter-gate dielectric 318 is also disposed between SG 304 and MG 302 to electrically isolate the doped polysilicon conductors of the gates. In some embodiments, such as that shown, the inter-gate dielectric 318 may include one or more of layers or films of dielectric materials having different dielectric properties. For example, the inter-gate dielectric 318 can include an ONO dielectric similar to that of the charge trapping dielectric 316.

The memory cell 300 further includes self-aligned silicides or SALICIDEs 320 over surfaces of the select gate 304 and S/D regions 310 and 312, and a sidewall spacer 322 surrounding both the SG and MG. The sidewall spacer 322 can include one or more layers of a dielectric material, such as silicon oxide or silicon nitride. The SALICIDEs 320 reduce resistance between contacts (not shown in this figure) to active regions of the memory cell, such as the S/D regions 310 and 312, and between contacts to the polysilicon of the SG 304 and, optionally in an embodiment not shown in this figure to the MG 302. In some embodiments, such as that shown in FIG. 3 the SALICIDE 320 formed on top of the SG 304 is pulled back or farther away from the sidewall adjacent the inter-gate dielectric 318 to provide further isolation against shorts or leakage between the SALICIDE and the MG 302. It is to be understood that this description is meant to provide a general overview of a split-gate architecture and that, in actual practice, many more detailed steps and layers are provided to form the final memory cell 300.

Figure 4:
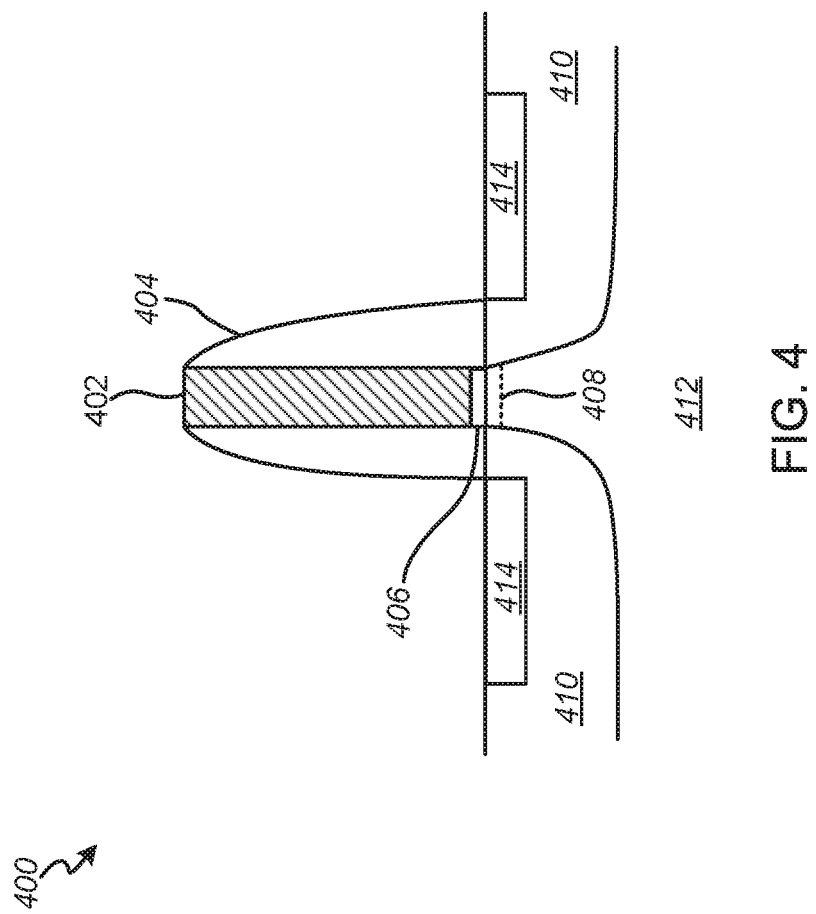
FIG. 4 is a detailed block diagram of a cross-section of an embodiment of a logic FET of FIG. 2 according to an embodiment of the present disclosure.

FIG. 4 illustrates an embodiment of a logic FET 400 suitable for use in the NVM device of FIGS. 1 and 2. In the embodiment shown, the logic FET 400 is a High-K Metal-Gate (HKMG) logic FET having a metal-gate 402 surrounded by a sidewall spacer 404 and a high-k gate dielectric 406 overlying a channel 408 separating source and drain (S/D) regions 410 formed in a substrate 412. The logic FET 400 further includes self-aligned silicides or SALICIDEs 414 on or over surfaces of the S/D regions 410 to reduce resistance between contacts (not shown in this figure) and the S/D regions. The metal-gate 402 can be made of any suitable metal or alloy, including but is not limited to, aluminum, copper, titanium, tungsten and alloys thereof. Suitable high-k dielectric material for the high-k gate dielectric 406 can include, but is not limited to, hafnium oxide, zirconium oxide, hafnium silicate, hafnium oxy-nitride, hafnium zirconium oxide and lanthanum oxide. Alternatively, the high-k gate dielectric 406 can include one or more layers suitable high-k dielectric material. The sidewall spacer 404 can include one or more layers of a dielectric material, such as silicon oxide or silicon nitride.

The metal-gate 402 of HKMG logic FETs 400 have a narrower width or narrower channel length than gates of previous generations of logic FETs, and therefore can improve performance of the memory device and reduce a size of a die or chip on which the memory device is fabricated.

In the past, with gates having lateral dimensions of about 40 nanometers (nm) and larger it was possible to integrally form memory cells, HVFETs and logic transistors on a single substrate using a thick gate polysilicon. However, as the lateral dimensions of circuit elements, such as gates, have continued to shrink it has become necessary to restrict heights of the circuit elements. In particular, the height of the metal gate 402 of a HKMG logic FET made using a gate replacement process is restricted to from about 300 to about 1000 angstroms (Å) to ensure the high aspect ratio openings resulting from the etching or removal of a sacrificial gate are completely filled with metal.

In a gate replacement process, described in greater detail below with reference to FIGS. 6A-6C and 7A-7I, a sacrificial or dummy gate is formed over the high-K gate dielectric 406, a sidewall spacer 404 formed around the sacrificial gate, and an inter-level dielectric (ILD) formed over the sidewall spacer and sacrificial gate. The ILD is then polished and planarized using CMP to expose a top of surface of the sacrificial gate, and the sacrificial gate removed from inside the sidewall spacers 404 using a selective etch process. The metal gate 402 is then deposited inside the sidewall spacers 404. Because the narrowest width of the metal gate can be from about 10 to about 40 nm, the height of the metal gate 402 of the HKMG logic FET is restricted to from about 300 to about 1000 Å. Furthermore, because of the CMP process necessary to planarize an inter-layer dielectric (not shown in this figure), the sidewall spacers 404 and expose the sacrificial gate, the heights of the gates of memory cells and HVFETs that are formed prior to or concurrently with the HKMG logic FET 400, and co-planar therewith, are also restricted to similar heights.

Figure 5:
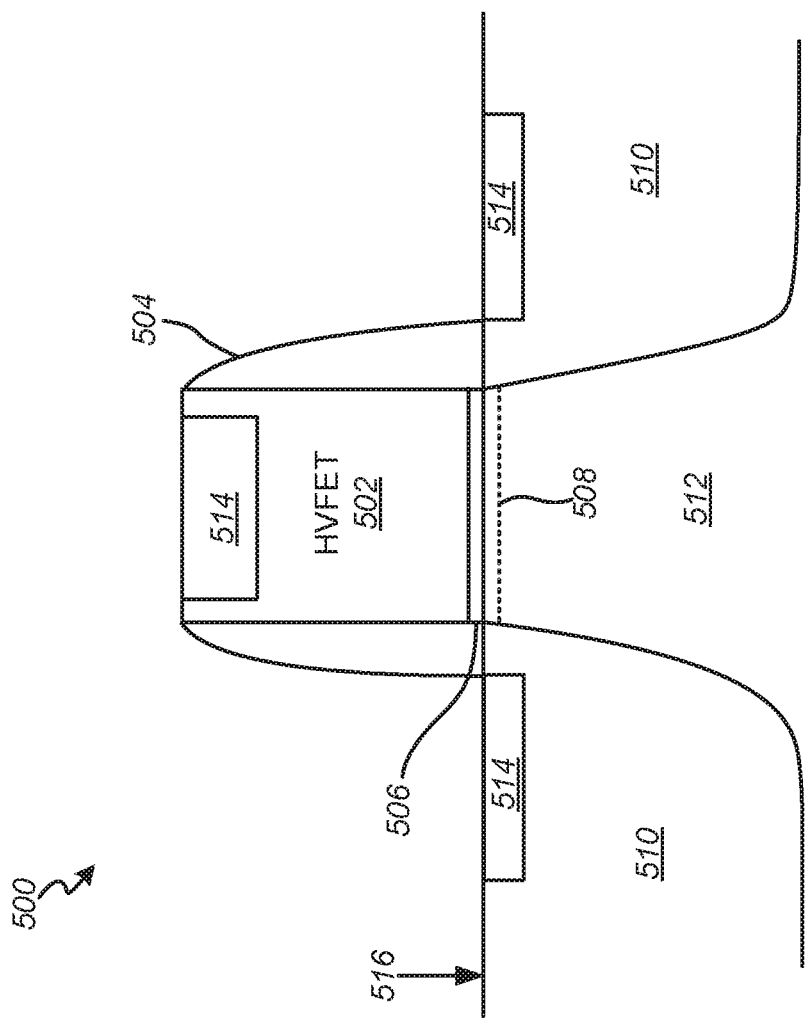
FIG. 5 is detailed a block diagram of a cross-section of an embodiment of a HVFET of FIG. 2 according to an embodiment of the present disclosure.

FIG. 5 illustrates an embodiment of a HVFET 500 suitable for use in the NVM device of FIGS. 1 and 2. The HVFET 500, which is fabricated according to an embodiment of the present disclosure, described in detail below with reference to FIGS. 6A-6C and 7A-7I, is capable of handling voltages of up to about 20 volts in magnitude. The HVFET 500 includes a doped polysilicon gate 502, surrounded by a sidewall spacer 504 and disposed on or over a HVFET gate dielectric 506 overlying a channel 508 separating source and drain (S/D) regions 510 formed in a substrate 512. The sidewall spacer 504 can include one or more layers of a dielectric material, such as silicon oxide or silicon nitride. The HVFET 500 further includes self-aligned silicides or SALICIDEs 514 formed on or over surfaces of the doped polysilicon gate 502 and the S/D regions 510 to reduce resistance between contacts (not shown in this figure) the doped polysilicon gate and the S/D regions.

In order to provide the required a high breakdown voltage, the HVFET 500 has a thicker HVFET gate dielectric 506, a longer channel 508, and deep S/D regions 510. The deep S/D regions 510 are formed using a high energy, low dose implant after the HVFET gate 502 formation to form a Lightly Doped Drain (LDD). By deep it is meant S/D regions 510 extending to depth of from about 400 to about 2000 Å below a surface 516 of the substrate 512. By a high energy, low dose implant it is meant implanting an appropriate ion species at an energy of from about 30 to about 100 kilo-electron volts (keV), and a dose of from about 1e12 $cm^{-3}$ to about 1e14 $cm^{-3}$.

Previous generations of HVFETs relied on a sufficiently thick doped polysilicon gate 502 to prevent the implanted ions from penetrating through the gate stack and reaching the channel 508 during the high-energy drain region implant. However, as noted above due to limitations imposed by the gate replacement process used to form the HKMG logic FET 400 the HVFET gate 502 needs to be equal to or less than about 1000 Å. Using an embodiment of the method of present disclosure the HVFET 500 can be fabricated to have deep S/D regions 510, fabricated in part by the LDD implant, with HVFET gate 502 formed from a thin polysilicon gate layer and having a gate height of from about 300 to about 1000 Å.

Figure 6A:
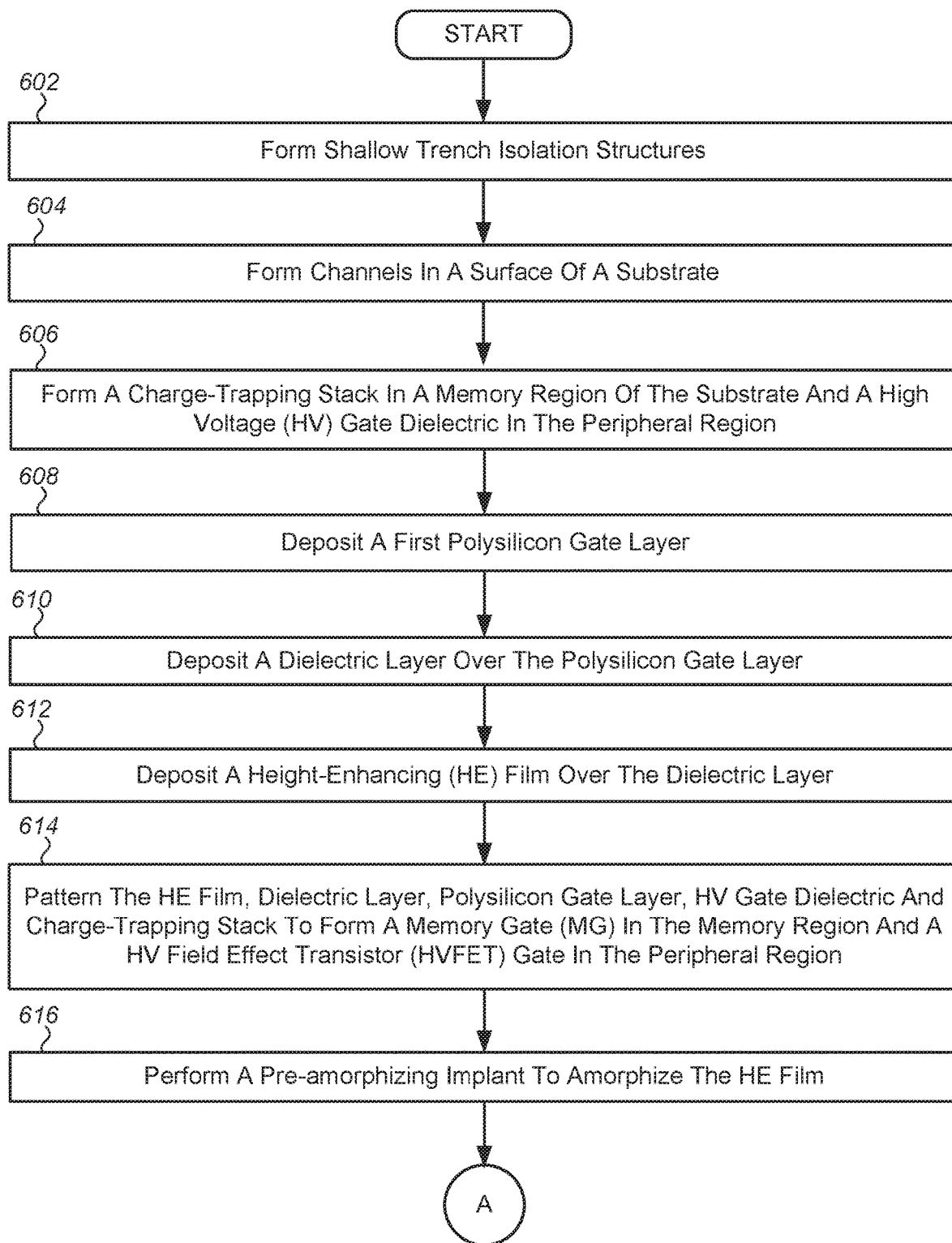
FIGS. 6A-6C is a flowchart depicting a method of manufacturing a NVM device according to an embodiment of the present disclosure.
Figure 6B:
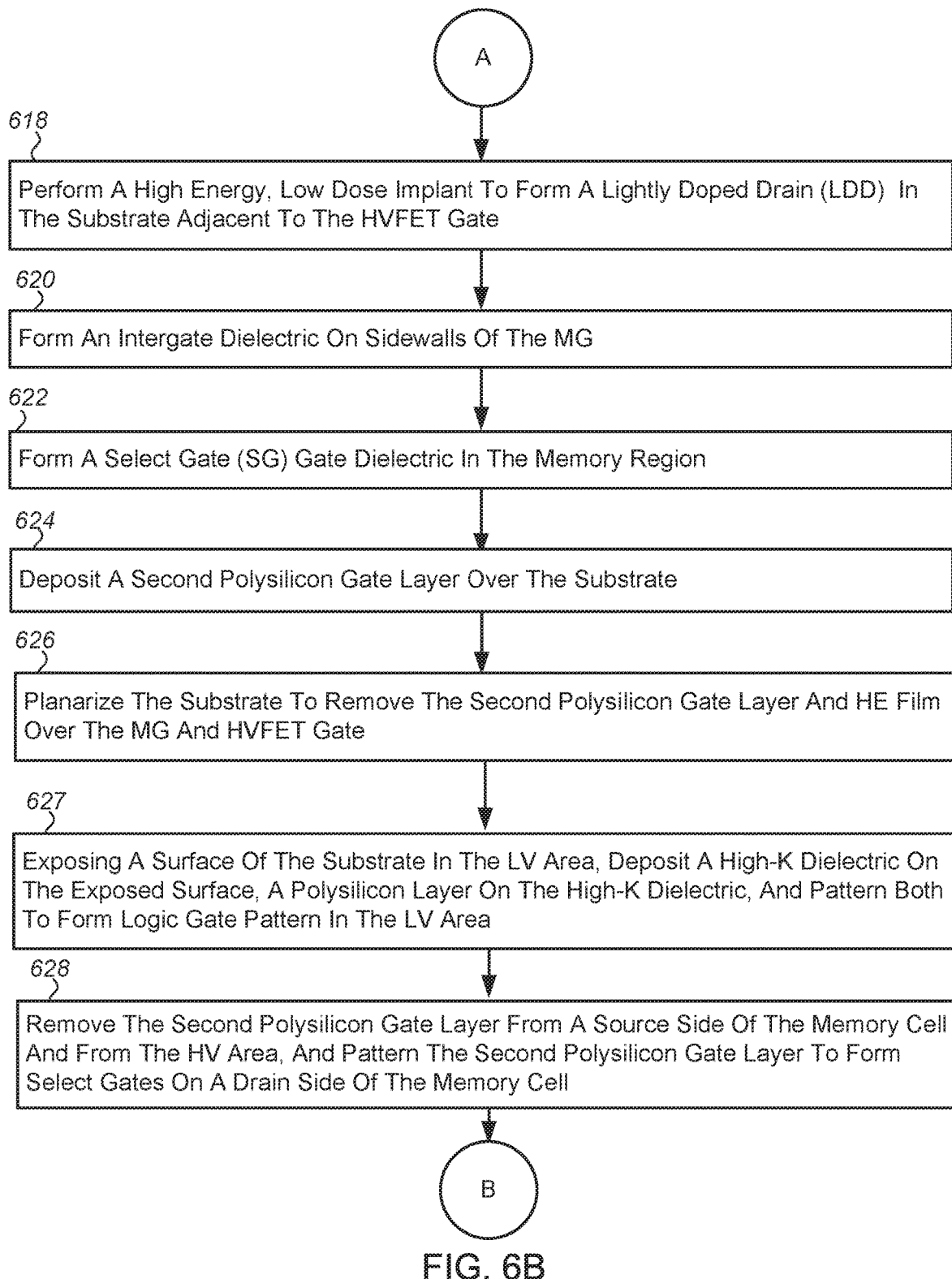
Figure 6C:
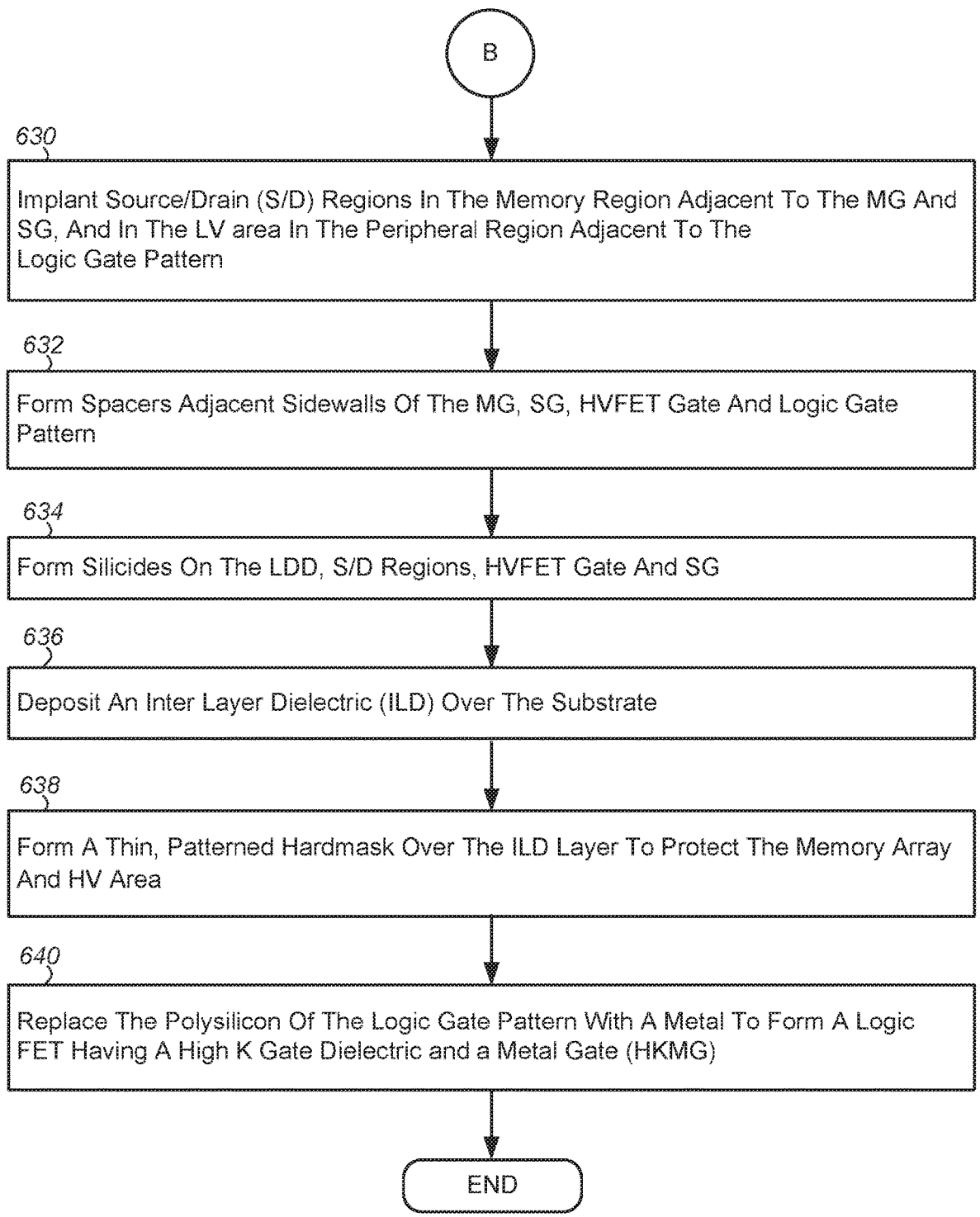

An embodiment of a method for manufacturing a NVM device including a memory cell, a HKMG logic FET and a HVFET embedded or integrally formed on a single substrate will now be described in detail with reference to FIGS. 6A-6C and 7A through 7I. FIGS. 6A-6C is a flowchart illustrating an embodiment of a method or process flow. FIGS. 7A through 7I are block diagrams illustrating cross-sectional views of a portion of a NVM device 700 during fabrication of the NVM device 700 according to the method of FIGS. 6A-6C.

Figure 7A:
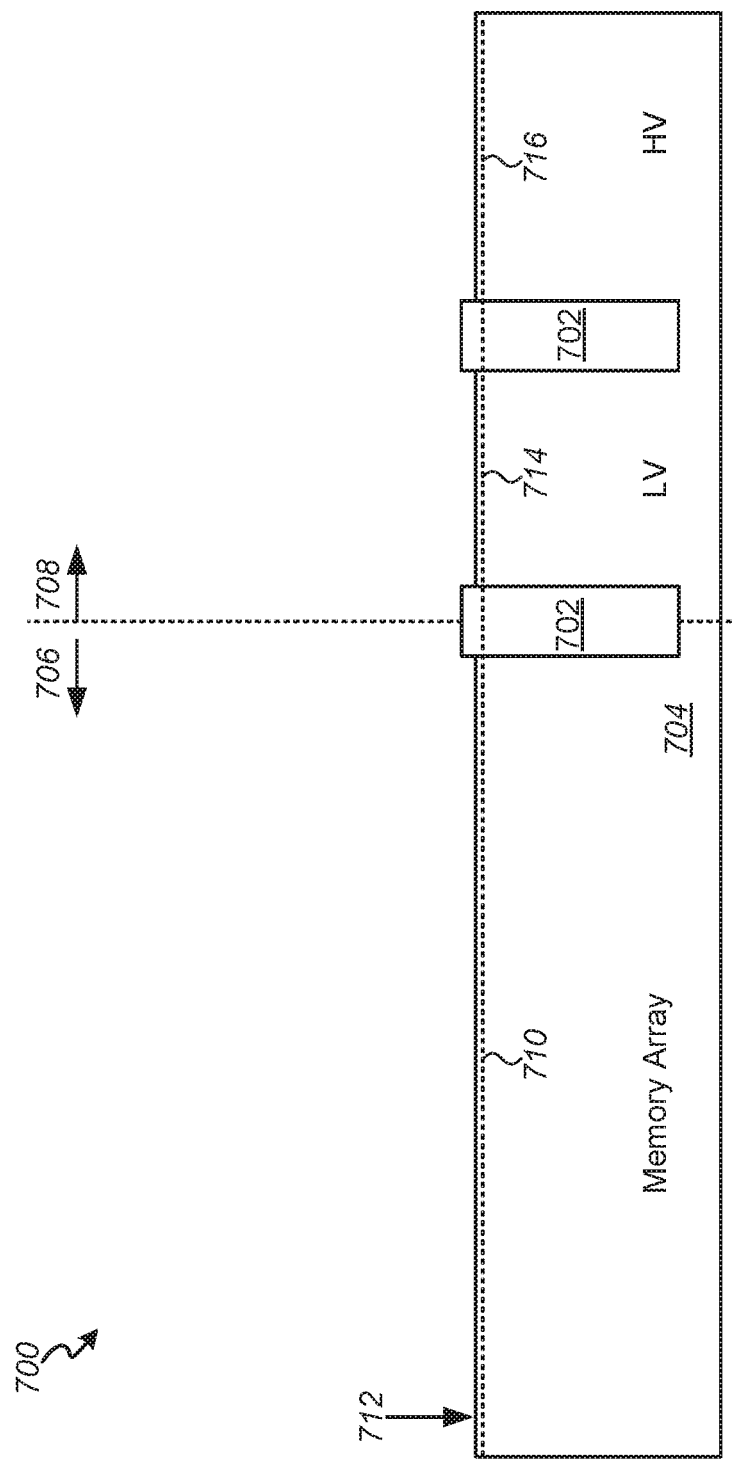
FIGS. 7A-7I illustrates a cross-section of a portion of a NVM device at various points during its manufacture according to the method of manufacturing of FIGS. 6A-6C.

Referring to FIGS. 6A and 7A, the process begins with forming shallow trench isolation (STI) structures 702 in a substrate 704 to electrically isolate an area in which a memory array is to be formed in a memory region 706 from a peripheral region 708, and to isolate a low voltage (LV) area in which a HKMG logic FET is to be formed from a high voltage (HV) area in which a HVFET is to be formed (step 602).

Next, a contiguous first channel 710 for a memory cell or cells is formed in a surface 712 of the substrate 704 in the memory region 706, a second channel 714 for the HKMG logic FET is formed in LV area of the peripheral region 708, and a third channel 716 for the HVFET is formed in the HV area (step 604). The channels 710, 714 and 716 can be formed by implanting an appropriate ion species using ion implantation technique. For example, a p-type channel implant can include implanting boron $B^+$ ions at energy of from about 5 to about 50 KeV, and to a concentration or dose of from about 1e11 $cm^{-3}$ to about 5e13 $cm^{-3}$, while a n-type channel implant can include implanting phosphorous or arsenic ions at a similar energy and to a similar dose.

Figure 7B:
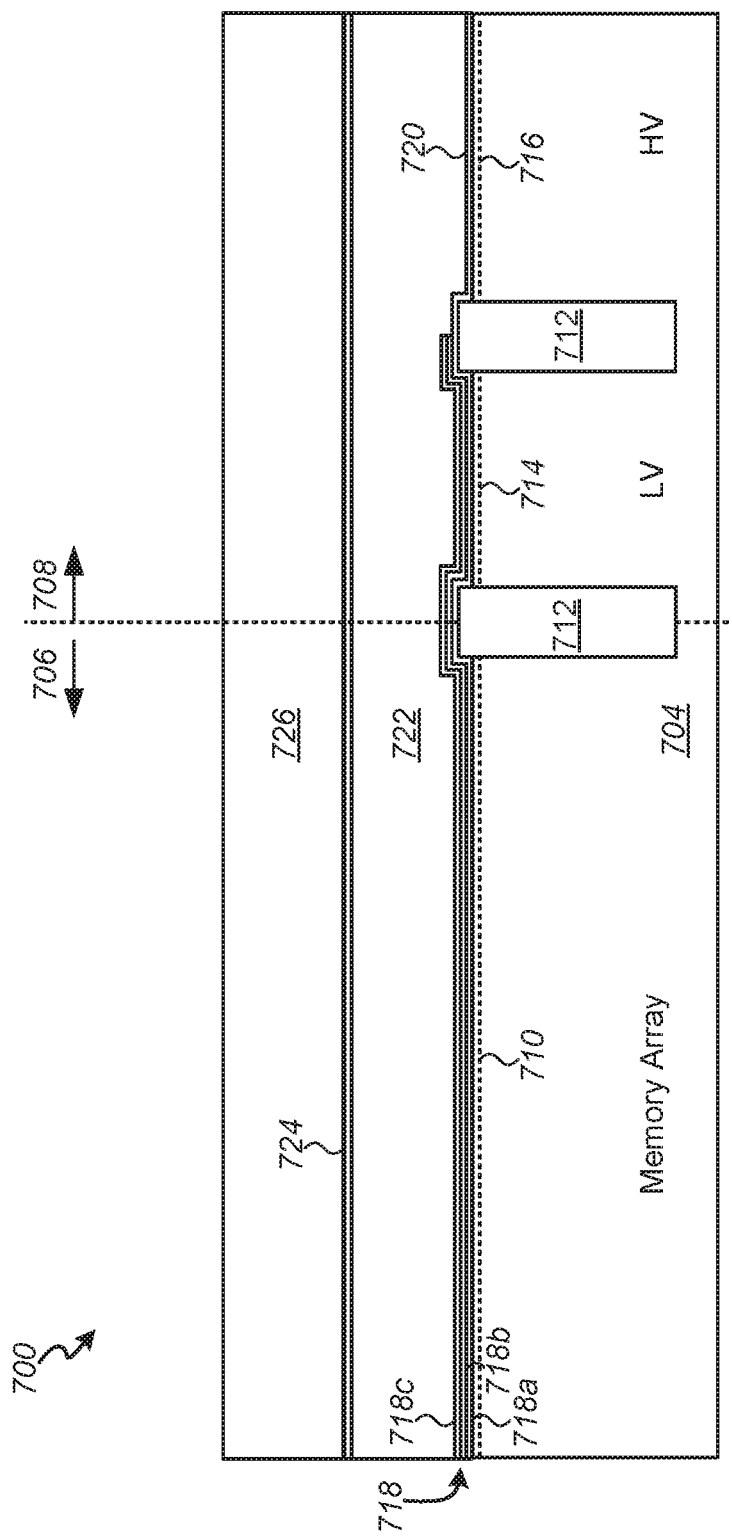

Referring to FIGS. 6A and 7B, the process continues with forming a charge-trapping stack 718 overlying the first channel 710 in the memory region 706, and a high voltage (HV) gate dielectric 720 overlying the third channel 716 in the HV area in the peripheral region 708 of the substrate 704 (step 606). In one embodiment, the charge-trapping stack 718 is formed by depositing or forming a tunnel layer 718a, a charge trapping or storage layer 718b, and a blocking layer 718c. The tunnel layer 718a can include a dielectric material, such as silicon dioxide ($SiO_2$), and can be either thermally grown or deposited by CVD, PECVD or ALD. A suitable dielectric charge trapping layer 718b can include one or more layers of silicon nitride (SiN), silicon-rich nitride, or silicon oxynitride (SiON), deposited by CVD, PECVD or ALD. Alternatively, the charge-storage layer 718b can include a conducting floating gate charge-storage layer polysilicon deposited by CVD, PECVD or ALD. The blocking layer 718c can include one or more layers of either a thermally grown or deposited silicon dioxide ($SiO_2$) and/or a high-k dielectric deposited by CVD, PECVD or ALD. Suitable high-k dielectric material for the blocking layer 718c can include, but is not limited to, hafnium oxide, zirconium oxide, hafnium silicate, hafnium oxy-nitride, hafnium zirconium oxide and lanthanum oxide Since the surface 712 of the substrate in 704 in the LV area in which a HKMG logic FET is to be formed is stripped prior to forming the HKMG logic FET, the charge-trapping stack 718 can also be allowed to extend over the LV area of the peripheral region 708, as shown.

The HV gate dielectric 720 is formed overlying the third channel 716 in the HV area of the peripheral region 708. The HV gate dielectric 720 can include one or more layers of a suitable dielectric material, such as silicon dioxide ($SiO_2$) or silicon nitride (SiN) deposited by CVD, PECVD or ALD. Alternatively, the HV gate dielectric 720 can include a high-K dielectric material, such as hafnium oxide, zirconium oxide, hafnium silicate, hafnium oxy-nitride, hafnium zirconium oxide or lanthanum oxide.

Next, a first polysilicon gate layer 722 is deposited over the charge-trapping stack 718 and the HV gate dielectric 720 (step 608). The first polysilicon gate layer 722 can be a doped polysilicon layer, and deposited to a thickness of from about 300 to about 1000 Å by CVD, PECVD or ALD. Alternatively, the first polysilicon gate layer 722 can be deposited as an undoped polysilicon layer, which is subsequently doped with an appropriate ion species and to an appropriate dose to function as a MG and HV gate.

A thin, dielectric layer 724 is formed over the first polysilicon gate layer 722 (step 610). The dielectric layer 724 can include a silicon dioxide ($SiO_2$) thermally grown or deposited to a thickness of from about 20 to about 500 Å by CVD, PECVD or ALD.

Next, a height-enhancing (HE) film 726 is deposit over the dielectric layer 724 (step 612). The HE film 726 can include an amorphous silicon or a polysilicon film deposited to a thickness of from about 400 to about 1000 Å by CVD, PECVD or ALD. Generally, the thickness of the HE film 726 is selected in view the thicknesses of the underlying dielectric layer 724 and first polysilicon gate layer 722, and the energy and dose of the HVFET region implant to be sufficient to prevent dopants from the region implant from reaching the third channel 716. For example, for a high energy, low dose region implant having an energy of from about 30 to about 100 keV, and a dose of from about 1e12 $cm^{-3}$ to about 1e14 $cm^{-3}$, a combined thickness of the first polysilicon gate layer 722, the dielectric layer 724 and the HE film 726 of from about 1000 to about 2500 Å. It has been found that a combined thickness in this range is sufficient to substantially prevent implanted ions from a deep region implant from penetrating through a HVFET gate stack including the first polysilicon gate layer 722, the dielectric layer 724 and the HE film 726 and reaching the third channel 716.

Figure 7C:
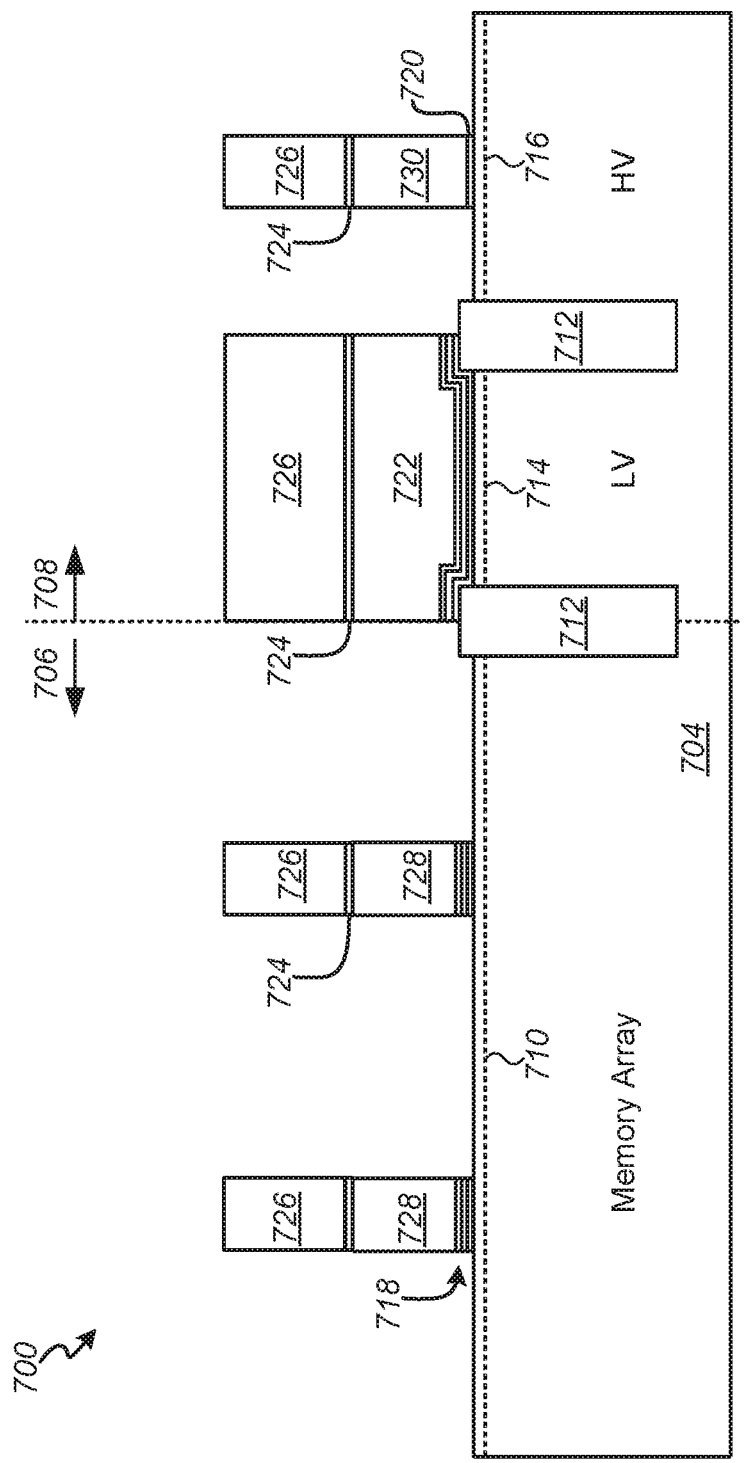

Referring to FIGS. 6A and 7C, the HE film 726, the dielectric layer 724, the first polysilicon gate layer 722, the HV gate dielectric 720 and the charge-trapping stack 718 are patterned to form a memory gate (MG 728) in the memory region 706 and a HVFET gate 730 in the peripheral region 708 (step 614). The HE film 726, the dielectric layer 724, the first polysilicon gate layer 722 and the charge-trapping stack 718 can be left in place over the LV area. The patterning can be accomplished using standard photolithographic techniques to form a mask over the surface of the HE film 726, and then anisotropically etching the HE film and underlying layers using any standard dry or wet etching technique. For example, polysilicon layers can be dry etched using a low pressure etch at a moderate power (about 500 W) in a plasma of polysilicon etch chemistries, such as $CHF_3$ or $C_2H_2$ or $HBr/O_2$; silicon dioxides ($SiO_2$) can be either wet or dry etched; and silicon nitride (SiN) can be dry etched using a low pressure plasma of a fluorine containing gas, such as $CF_4$, or $CHF_3$. After the HE film 726, the dielectric layer 724, the first polysilicon gate layer 722, the HV gate dielectric 720 and the charge-trapping stack 718 have been etched or patterned to form the MG 728 and HVFET gate 730 in shown in FIG. 7C, any remaining photoresist from the mask (not shown in this figure) is stripped and a wet clean performed. Alternatively, the MG 728 and HVFET gate 730 can patterned in separate etching steps through use of an additional mask layer.

Optionally, a pre-amorphizing implant can be performed to amorphize the HE film 726 remaining over the MG 728 and HVFET gate 730 (step 616). The pre-amorphizing implant can be performed using any suitable semiconductor material or dopant. For example, the pre-amorphizing implant can include implanting germanium (Ge) ions at an energy of from about 5 to about 50 keV, and to a dose of from about 1e13 $cm^{-3}$ to about to about 5e15 $cm^{-3}$. Amorphizing the HE film 726 prior to performing a high energy, low dose implant to form a deep, Lightly Doped Drain (LDD) of the HVFET, improves the ability of the HE film 726 to prevent implanted ions from penetrating through the HVFET gate stack and reaching the channel 716.

Figure 7D:
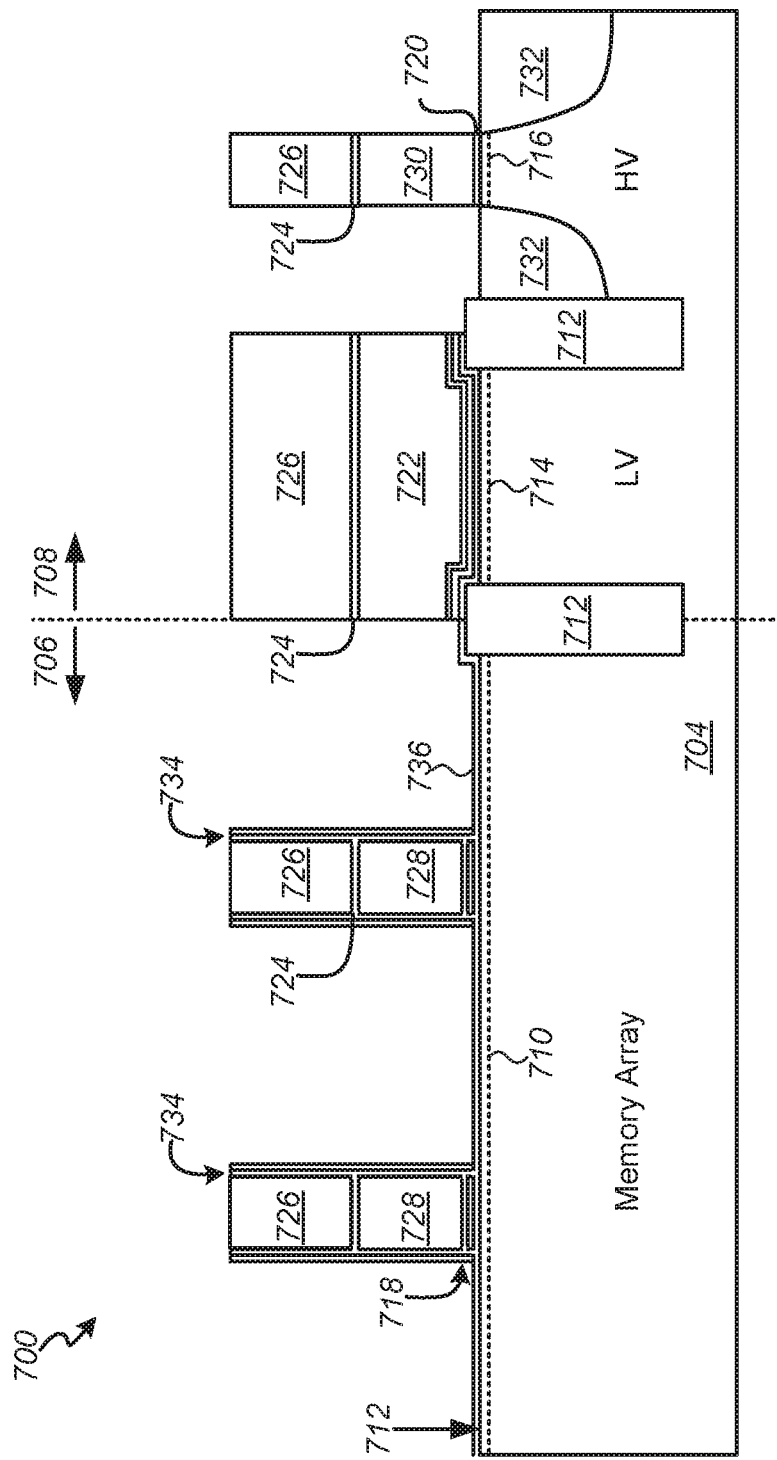

Referring to FIGS. 6B and 7D a high energy, low dose implant is performed to form one or more LDDs 732 in the substrate 704 adjacent to the HVFET gate 730 (step 618). As noted above, the implant can include implanting an appropriate ion species at an energy of from about 30 to about 100 kilo-electron volts (keV), to a dose of from about 1e12 $cm^{-3}$ to about 5e14 $cm^{-3}$, which will provide LDDs 732 extending to depth of from about 400 to about 2000 Å below a surface of the substrate 704.

An inter-gate dielectric 734 is then formed on sidewalls of the MG 728 (step 620). As noted above, the inter-gate dielectric 734 can include one or more of layers or films of dielectric materials having different dielectric properties. For example, the inter-gate dielectric 734 can include an ONO dielectric similar to that of the charge trapping stack 718, and can be deposited using the same CVD, PECVD or ALD techniques to a thickness of from about 100 to about 500 Å.

Next, any material remaining on the surface of the substrate 704 from formation of the inter-gate dielectric 734 in the memory region 706 is removed, and a SG gate dielectric 736 is formed over the surface of the substrate in the memory region for a SG to be formed adjacent the MG 728 (step 622). It will be understood the material remaining on the surface can be removed using an anisotropic dry etch using any standard oxide and nitride plasma etch chemistries described above. The SG gate dielectric 736 can include one or more layers of a suitable dielectric material, such as silicon oxide or silicon nitride deposited by CVD, PECVD or ALD to a thickness of from about 10 to about 60 Å. Alternatively, the SG gate dielectric 730 can include a suitable high-K dielectric material, such as hafnium oxide, zirconium oxide, hafnium silicate, hafnium oxy-nitride, hafnium zirconium oxide and lanthanum oxide.

Figure 7E:
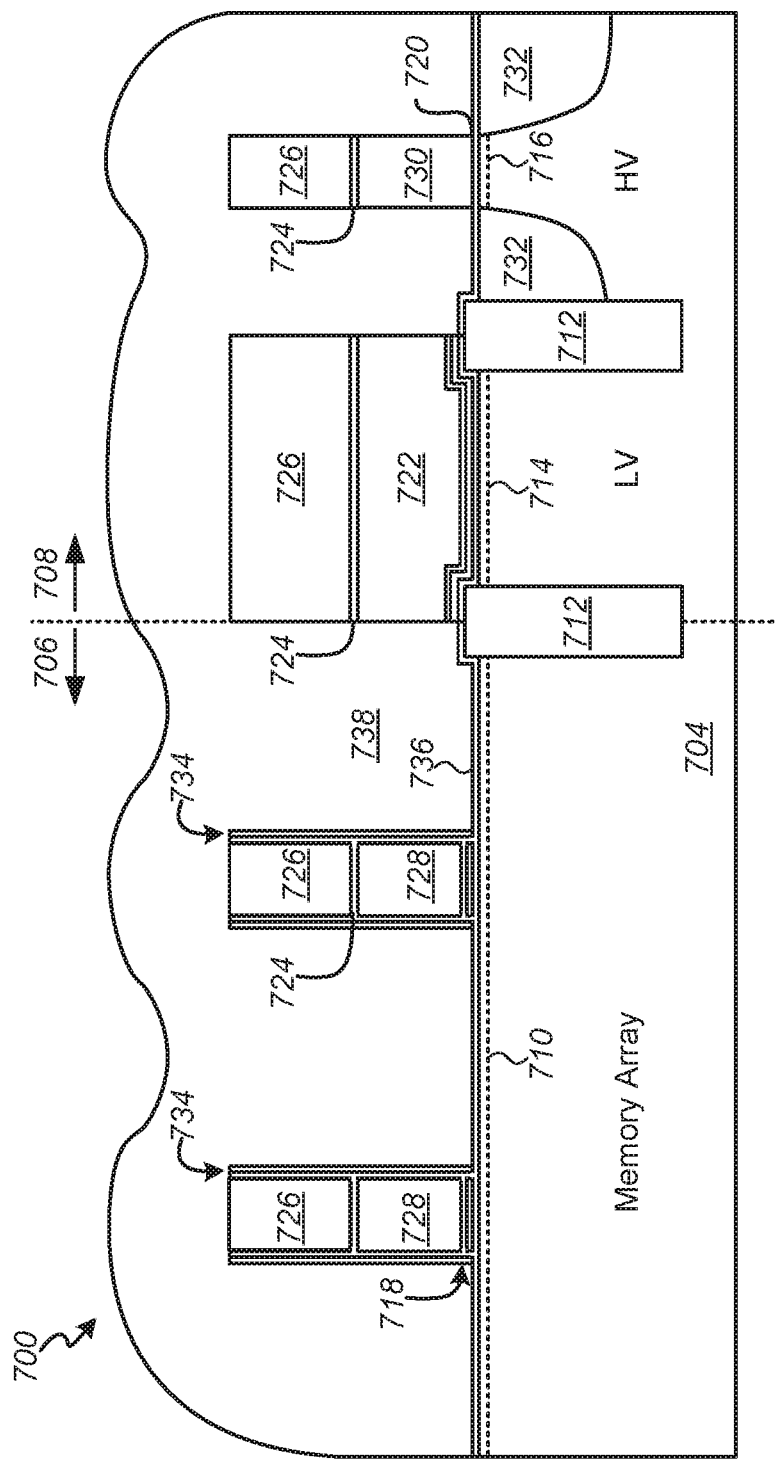

Referring to FIGS. 6B and 7E a second polysilicon gate layer 738 is deposited over the MGs 728, the HVFET gate 730 and the surface 712 of the substrate 704 (step 624). As with the first polysilicon gate layer 722, the second polysilicon gate layer 738 can include a doped polysilicon layer or an undoped polysilicon layer that is subsequently doped, and is deposited to a thickness of at least about 400 Å by CVD, PECVD or ALD.

Figure 7F:
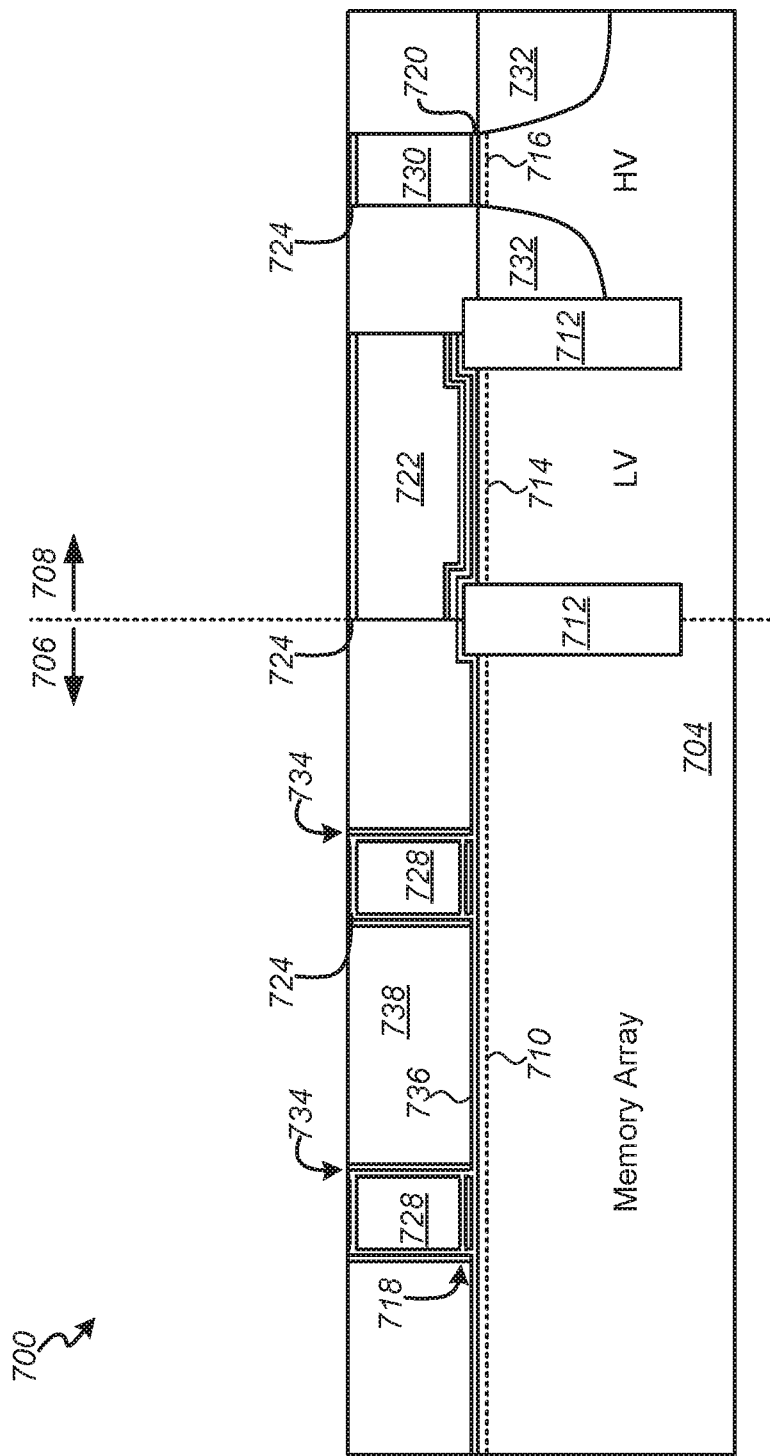

Referring to FIGS. 6B and 7F a layer on or over surface of the substrate 704 is planarized or polished using a plasma etch, a CMP process, or a combination thereof to remove the portion of the second polysilicon gate layer 738 and the HE film 726 over the MGs 728 and HVFET gate 730, and to planarize the second polysilicon gate layer (step 626). The portions of the dielectric layer 724 remaining on the MGs 728 and HVFET gate 730 can serve as a stop layer for the CMP or the plasma etch used for the planarization.

Figure 7G:
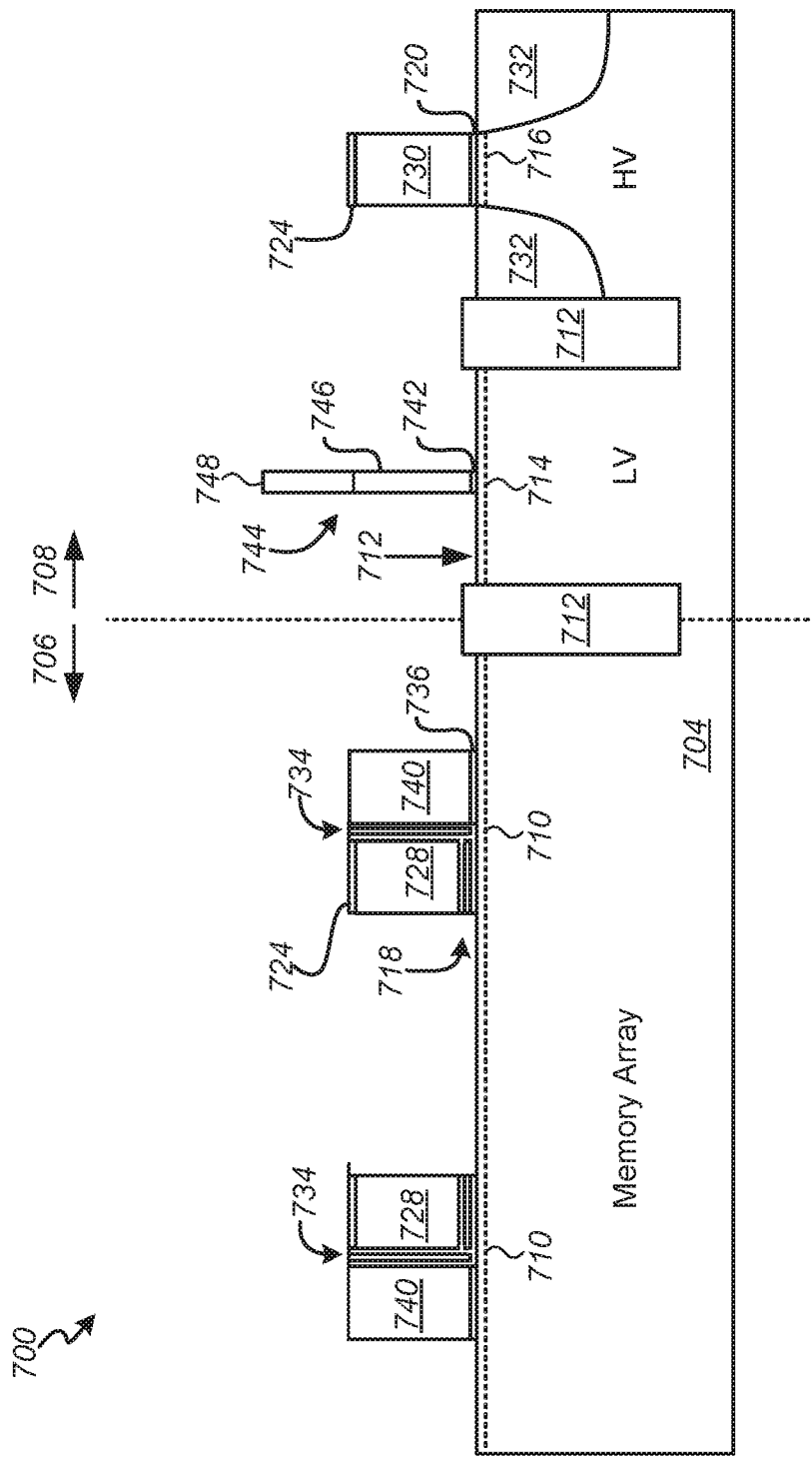

Referring to FIGS. 6B and 7G, the gate stack including the first polysilicon gate layer 722 and the dielectric layer 724 in the LV area of the periphery region of 708 is removed, exposing the surface 712 of the substrate 704. A high-K gate dielectric 742 deposited on the exposed surface, a doped or undoped polysilicon or amorphous silicon layer deposited on the high-K gate dielectric, and both layers patterned to form a logic gate pattern 744 in the LV area (step 627). After that, the second polysilicon gate layer 738 is removed from one side, e.g. a source side, of the memory cell and from the HV area, the second polysilicon gate layer 738 planarized, and patterned to form select gates (SG 740) on the other side, e.g. a drain side, of the memory cell drain in the memory region 706 (step 628). For example, polysilicon layers can be dry etched using a low pressure etch at a moderate power (about 500 W) in a plasma of standard polysilicon etch chemistries, such as $CHF_3$ or $C_2H_2$ or $HBr/O_2$; silicon dioxides can be either wet or dry etched; and nitride layers can be etched using a low pressure nitride etch in a plasma of a fluorine containing gas, such as $CF_4$, or $CHF_3$.

The high-k gate dielectric 742 can include one or more layers of high-k dielectric material, such as hafnium oxide, zirconium oxide, hafnium silicate, hafnium oxy-nitride, hafnium zirconium oxide and lanthanum oxide, deposited to a thickness of from about 10 to about 80 Å, using by CVD, PECVD or ALD.

The logic gate pattern 744 includes a number of dummy or sacrificial gates 746 formed from a doped or undoped polysilicon or amorphous silicon deposited to a thickness of from about 300 to about 1000 Å, using by CVD, PECVD or ALD, and patterned using a patterned hardmask 748 and any of the polysilicon or silicon dry etching techniques described above. The patterned hardmask 748 is generally formed by patterning a layer of dielectric material, such as silicon dioxide ($SiO_2$) or silicon nitride (SiN), using standard photolithographic and etching techniques.

Figure 7H:
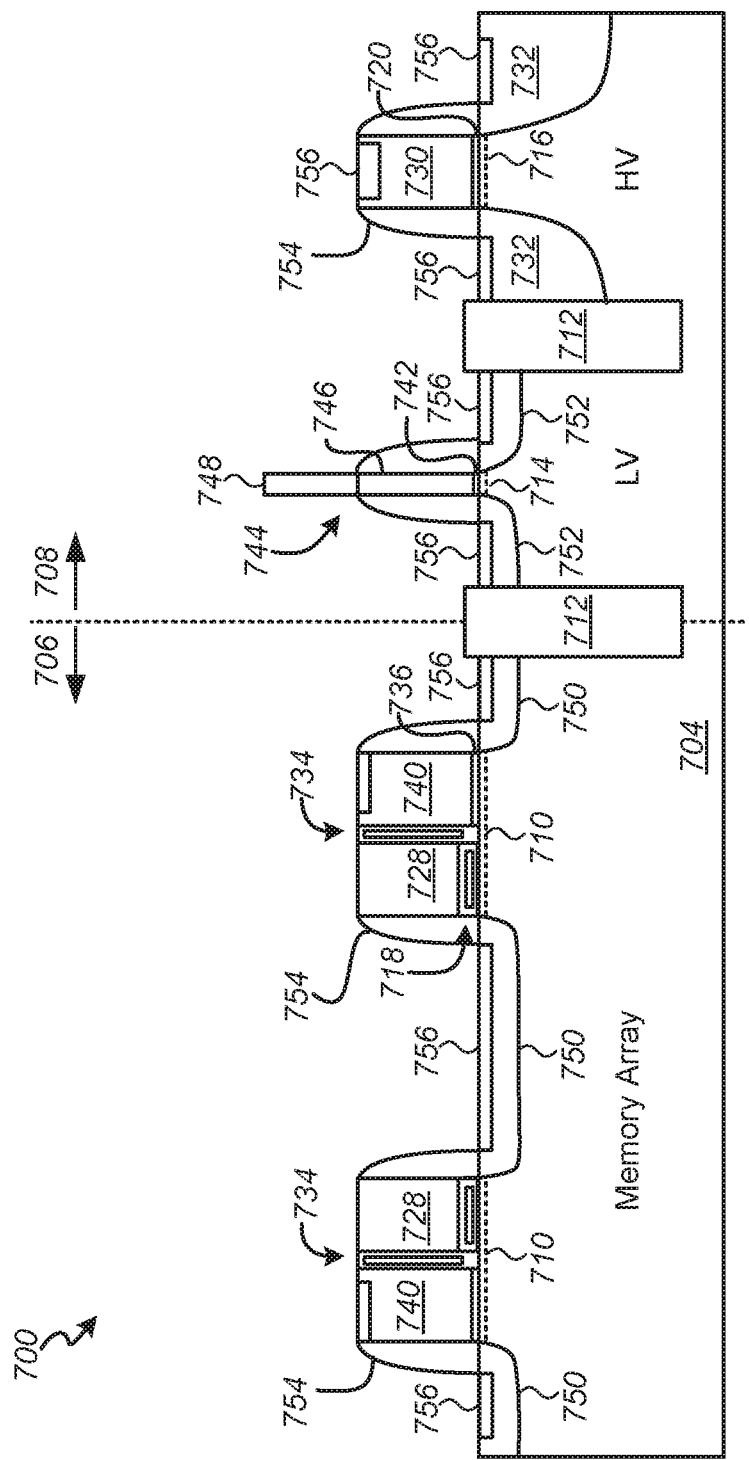

Referring to FIGS. 6C and 7H, dopant ions of an appropriate species are implanted to form a source/drain (S/D) regions 750, in the memory region 706 adjacent to the MG 728 and SG 740, and S/D regions 752 in the LV area in the peripheral region 70 adjacent to logic gate pattern 744 (step 630). Generally, because these S/D regions 750/752 are not deep, the implants are typically performed at a lower energy of from about 1 to about 50 kilo-electron volts (keV), to a moderately heavy dose of from about 1e13 $cm^{-3}$ to about 2e15 $cm^{-3}$. Because of the lower energy of these implants the thin polysilicon of the HVFET gate 730 is sufficiently thick to prevent any implanted ions from reaching the channel 716. However, to avoid undesirably increasing the concentration of dopants in the LDD 732, the HV area is preferably masked prior to performing the implant.

Next, spacers 754 are formed adjacent to sidewalls of the MG 728, SG 740, HVFET gate 730 and the logic gate pattern 744 (Step 632). The spacers 754 are generally formed by sequentially deposition of a conformal dielectric layer, such as silicon dioxide ($SiO_2$) or silicon nitride (SiN), followed by a blanket or spacer etch to remove most of the dielectric material deposited on horizontal surfaces of the substrate 704, resulting in the spacer shapes shown.

Self-Aligned Silicides or SALICIDEs 756 are then formed on the LDD 732 and S/D regions 750/752 adjacent to the MG 728, SG 740 and the logic gate pattern 744 (Step 634). SALICIDEs can also be formed on the HVFET gate, and at least one of the MG and SG polysilicon gates. The SALICIDEs 756 can include any suitable transition metal, such as titanium, cobalt, nickel, platinum, and/or tungsten, and can be formed by any silicide processes commonly employed in the art, including for example a pre-clean etch, metal deposition, anneal and wet strip.

Figure 7I:
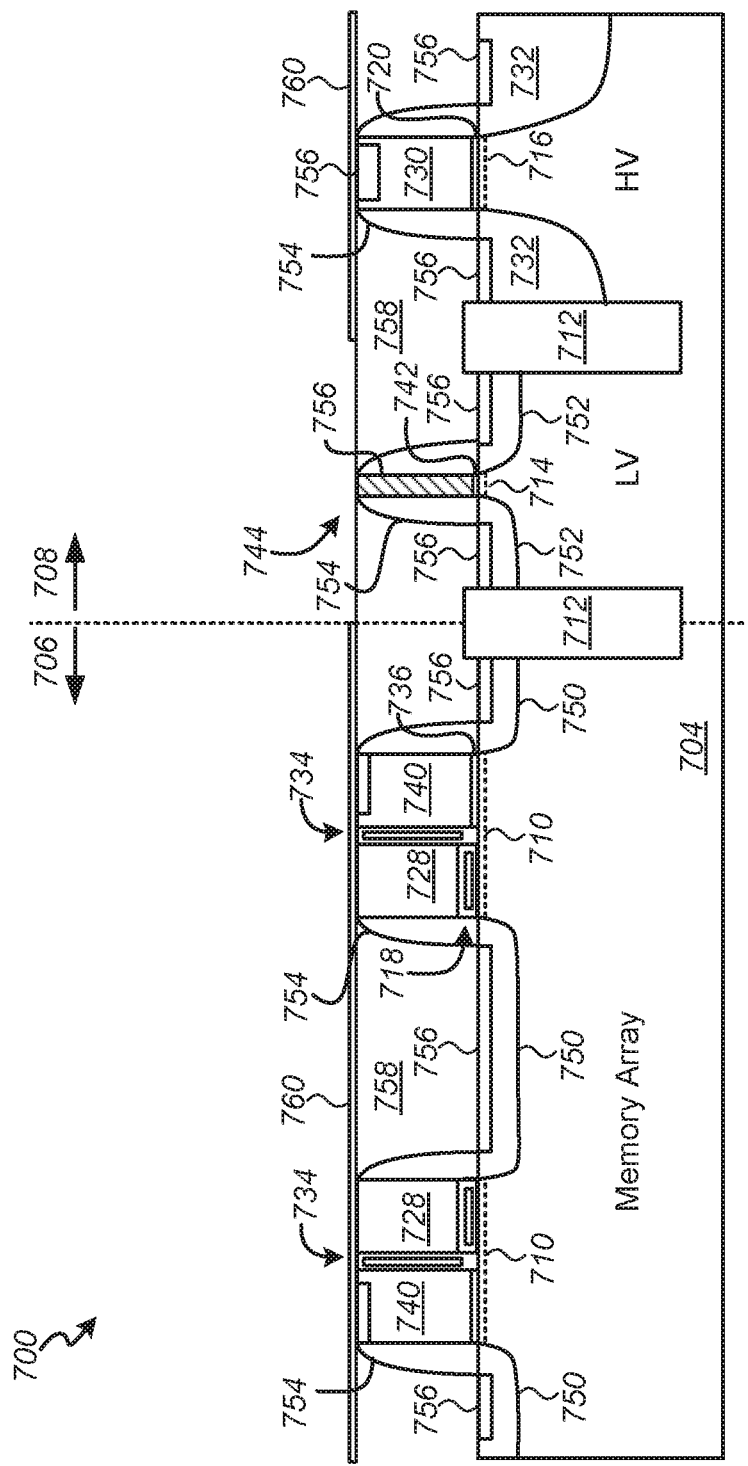

Referring to FIGS. 6C and 7I, an inter-layer dielectric (ILD 758) is formed or deposited over the substrate 704, and planarized using a CMP process to form a planarized surface through which a top surface of the sacrificial gate is exposed (step 636). Generally, the ILD 758 can include any suitable dielectric material such as silicon dioxide ($SiO_2$), and can be deposited or formed using suitable, standard deposition technique, including CVD.

Next, a thin, patterned hardmask 760 is formed over the memory array in the memory region 706 and over the HV area in the peripheral region 708 (step 638). The patterned hardmask 760 is generally formed by patterning a layer of dielectric material, such as silicon nitride, using standard photolithographic and etching techniques.

The sacrificial gate 746 is then removed from inside the spacer 754 in the LV and the resultant openings filled with a metal to form a metal gate 756 of a HKMG logic FET (step 640). The sacrificial gate 746 can be removed using standard polysilicon etch chemistries, such as $CHF_3$ or $C_2H_2$ or $HBr/O_2$. Generally, the metal can include any suitable metal such as aluminum, copper, titanium, tungsten and alloys thereof, and can be deposited or formed using suitable, standard deposition technique, including CVD and physical vapor deposition (PVD), such as sputtering to deposit a metal layer, which is again planarized in a CMP process to remove the portions of the metal layer not in the spacer 754 opening. It is noted that because the MG 722, SG 734 and HVFET gate 724 are covered by patterned hardmask 760, neither the gates nor the SALICIDEs 750 are damaged in the etch or metal deposition process.

Finally, the patterned hardmask 760 may or may not be removed, and one or more vertical contacts or vias formed through the ILD 758 to the SALICIDEs 750.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Thus, a NVM device including a memory cell, a HKMG logic FET and a HVFET embedded or integrally formed on a single substrate, and methods of forming the same have been disclosed. Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of fabricating a semiconductor device comprising:
   forming a charge trapping stack over a surface of a substrate in a memory region;
   forming a gate dielectric over the surface of the substrate in a peripheral region;
   depositing a first polysilicon layer and a height-enhancing (HE) film over the surface of the substrate in the memory region and the peripheral region;
   patterning the HE film, first polysilicon layer, and the charge trapping stack to form a memory-gate in the memory region;
   patterning the HE film, first polysilicon layer, and the gate dielectric in a high voltage (HV) area in the peripheral region to form a HV-gate;
   depositing a second polysilicon layer over the surface of the substrate;
   planarizing the second polysilicon layer to remove portions of the second polysilicon layer extending above the memory-gate and HV-gate; and
   implanting ions to form a first source/drain (S/D) region in the substrate adjacent to the HV-gate, wherein the first S/D region comprises the ions implanted to a depth in the substrate greater than a height of the HV-gate above the surface of the substrate.

2. The method of claim 1 wherein a channel underlying the HV-gate is substantially free of the ions implanted during forming of the first S/D region.

3. The method of claim 1 wherein patterning the first polysilicon layer to form the memory-gate and patterning the first polysilicon layer to form the HV-gate are accomplished concurrently in single patterning operation.

4. The method of claim 1 further comprising:
   patterning the second polysilicon layer to form a select-gate in the memory region adjacent to the memory-gate.

5. The method of claim 4 further comprising:
   forming, prior to patterning the second polysilicon layer, a logic-gate-pattern in a low voltage (LV) area in the peripheral region.

6. The method of claim 5 further comprising:
   forming, after patterning the second polysilicon layer, spacers on sidewalls of the logic-gate-pattern, HV-gate, memory-gate and select-gate; and
   implanting ions to form second source and drain (S/D) regions in the substrate adjacent to the logic-gate-pattern, memory-gate and select-gate.

7. The method of claim 6 further comprising forming silicide over the first and second S/D regions adjacent the logic-gate-pattern, HV-gate, memory-gate and select-gate, and on top surfaces of the HV-gate and select-gate.

8. The method of claim 6 further comprising;
   depositing and planarizing an inter-layer dielectric (ILD) over the surface of the substrate through which a top surface of the logic-gate-pattern is exposed;
   removing the logic-gate-pattern; and
   filling a resulting opening in the ILD with a metal to form a high-k metal-gate (HKMG).

9. The method of claim 8 wherein the HV-gate, memory-gate, select-gate, and HKMG comprise substantially equal heights above the surface of the substrate.

10. A method of fabricating a semiconductor device comprising:
    depositing a first polysilicon layer over a charge trapping stack formed over a surface of a substrate in a memory region and a gate dielectric formed over the surface of the substrate in a peripheral region;
    patterning the first polysilicon layer, the charge trapping stack and the gate dielectric to form a memory-gate in the memory region and a high voltage (HV)-gate in a HV area of the peripheral region;
    implanting ions in the substrate adjacent to the HV-gate to form a first source/drain (S/D) region;
    depositing a second polysilicon layer over the surface of the substrate;
    planarizing the second polysilicon layer to remove portions of the second polysilicon layer extending above top surfaces of the memory-gate and HV-gate;
    forming a logic-gate-pattern for a low voltage (LV)-gate in a LV area in the peripheral region while protecting the memory-gate and HV-gate using remaining portions of the second polysilicon; and
    patterning the remaining portions of the second polysilicon layer to form a select-gate in the memory region adjacent to the memory-gate, wherein the first S/D region comprises ions implanted to a depth in the substrate greater than a height of the HV-gate above the surface of the substrate, and a channel underlying the HV-gate is substantially free of the ions implanted.

11. The method of claim 10, wherein the memory gate and the HV-gate are made out of same materials from the first polysilicon layer and include top surfaces that have substantially same elevation from the substrate.

12. The method of claim 10 further comprising after patterning the remaining portions of the second polysilicon layer:
    forming spacers on sidewalls of the logic-gate-pattern, HV-gate, memory-gate and select-gate; and
    implanting ions to form second source and drain (S/D) regions in the substrate adjacent to the logic-gate-pattern, memory-gate and select-gate.

13. The method of claim 12 further comprising forming silicide over the first and second S/D regions adjacent the logic-gate-pattern, HV-gate, memory-gate and select-gate, and on top surfaces of the HV-gate and select-gate.

14. The method of claim 12 further comprising;
    depositing and planarizing an inter-layer dielectric (ILD) over the surface of the substrate through which a top surface of the logic-gate-pattern is exposed;
    removing the logic-gate-pattern; and
    filling a resulting opening in the ILD with a metal to form a high-k metal-gate (HKMG).

15. The method of claim 14 wherein the HV-gate, memory-gate, select-gate, and HKMG comprise substantially equal heights above the surface of the substrate.

16. A method of fabricating a semiconductor device comprising:
    forming a charge trapping stack over a surface of a substrate in a memory region;
    forming a gate dielectric over the surface of the substrate in a peripheral region;
    depositing a first polysilicon layer over the surface of the substrate in the memory region and the peripheral region;
    depositing a height-enhancing (HE) film over the first polysilicon layer;
    patterning the HE film, the first polysilicon layer and the charge trapping stack to form a memory-gate in the memory region; and
    patterning the HE film, the first polysilicon layer and the gate dielectric to form a first-gate in a first area of the peripheral region; and implanting ions in the substrate adjacent to the first-gate to form a source/drain (S/D) region;

depositing a second polysilicon layer over the surface of the substrate;

planarizing the second polysilicon layer to remove substantially all of the HE film and portions of the second polysilicon layer extending above top surfaces of the memory-gate and first-gate; and patterning remaining portions of the second polysilicon layer to form a select-gate in the memory region adjacent to the memory-gate.

17. The method of claim 16 wherein the S/D region comprises ions implanted to a depth in the substrate greater than a height of the first-gate above the surface of the substrate.

18. The method of claim 16 wherein patterning the HE film, the first polysilicon layer and the charge trapping stack to form the memory-gate, and patterning the HE film, the first polysilicon layer and the gate dielectric to form the first-gate are accomplished concurrently in single patterning operation.

19. The method of claim 16 further comprising prior to patterning the remaining portions of the second polysilicon forming a gate-pattern for a second-gate in a second area in the peripheral region, wherein the remaining portions of the second polysilicon protect the memory-gate and first-gate during forming of the gate-pattern.

20. The method of claim 19 further comprising after patterning the second polysilicon layer:

depositing and planarizing an inter-layer dielectric (ILD) over the surface of the substrate through which a top surface of the gate-pattern is exposed;

removing the gate-pattern; and filling a resulting opening in the ILD with a metal to form a high-k metal-gate (HKMG).

21. The method of claim 20 wherein the first-gate, memory-gate, select-gate, and HKMG comprise substantially equal heights above the surface of the substrate.

* * * * *